(12) United States Patent
Bierhuizen et al.

(10) Patent No.: US 7,902,560 B2
(45) Date of Patent: Mar. 8, 2011

(54) TUNABLE WHITE POINT LIGHT SOURCE USING A WAVELENGTH CONVERTING ELEMENT

(75) Inventors: Serge J. Bierhuizen, Milpitas, CA (US); Gerard Harbers, Sunnyvale, CA (US)

(73) Assignees: Koninklijke Philips Electronics N.V., Eindhoven (NL); Philips Lumileds Lighting Company LLC, San Jose, CA (US)

( * ) Notice: Subject to any disclaimer, the term of this patent is extended or adjusted under 35 U.S.C. 154(b) by 636 days.

(21) Appl. No.: 11/611,351

(22) Filed: Dec. 15, 2006

(65) Prior Publication Data

US 2008/0142816 A1 Jun. 19, 2008

(51) Int. Cl.
*H01L 27/15* (2006.01)

(52) U.S. Cl. .......... 257/82; 257/98; 257/88; 257/81; 257/E25.009

(58) Field of Classification Search .......... 257/98, 257/88, 81, 82
See application file for complete search history.

(56) References Cited

U.S. PATENT DOCUMENTS

| | | | | |
|---|---|---|---|---|
| 6,234,648 B1 * | 5/2001 | Borner et al. | | 362/235 |
| 6,404,125 B1 * | 6/2002 | Garbuzov et al. | | 313/499 |
| 6,563,139 B2 * | 5/2003 | Hen | | 257/89 |
| 2004/0256626 A1 | 12/2004 | Wang et al. | | |
| 2005/0221519 A1 * | 10/2005 | Leung et al. | | 438/27 |
| 2006/0105478 A1 | 5/2006 | Camras et al. | | |
| 2006/0197098 A1 | 9/2006 | Aihara | | |
| 2006/0258028 A1 * | 11/2006 | Paolini et al. | | 438/22 |

FOREIGN PATENT DOCUMENTS

| | | |
|---|---|---|
| DE | 20309033 U1 | 1/2004 |
| DE | 102005020695 A1 | 12/2005 |
| EP | 1566848 A2 | 8/2005 |
| EP | 1605199 A2 | 12/2005 |
| WO | 2005112137 A1 | 11/2005 |
| WO | 2006085693 A1 | 8/2006 |

OTHER PUBLICATIONS

International Search Report and Written Opinion, 13 pages.

* cited by examiner

*Primary Examiner* — Jerome Jackson, Jr.
*Assistant Examiner* — Dale Page

(57) ABSTRACT

A uniform high brightness light source is provided using a plurality of light emitting diode (LED) chips with slightly different pump wavelengths with a wavelength converting element that includes at least two different wavelength converting materials that convert the light to different colors of light. The intensity of the light produced by the LED chips may be varied to provide a tunable CCT white point. The wavelength converting element may be, e.g., a stack or mixture of phosphor or luminescent ceramics. Moreover, the manufacturing process of the light source is simplified because the LED chips are all manufactured using the same technology eliminating the need to manufacture different types of chips.

11 Claims, 3 Drawing Sheets

100 # TUNABLE WHITE POINT LIGHT SOURCE USING A WAVELENGTH CONVERTING ELEMENT

FIELD OF THE INVENTION

The present invention is related to a light source that produces white light and in particular to a light source using multiple light emitting diodes that produces light having a desired correlated color temperature (CCT).

BACKGROUND

Recently there has been a trend in replacing conventional incandescent light bulbs with light emitting diodes (LEDs). For example, traffic control signals and automobile brake lights are now manufactured using LEDs. The replacement of conventional incandescent light bulbs with one or more LEDs is desirable because incandescent bulbs are inefficient relative to LEDs, e.g., in terms of energy use and longevity.

Certain lighting applications, however, pose particular problems for replacing incandescent bulbs with LEDs. For example, some highly noticeable lighting applications, such as accent or spot lamps, require white light with a particular correlated color temperature (CCT). Replacing incandescent light bulbs with LEDs in such lighting applications is problematic because of the difficulty in controlling the spectral distribution, i.e. the CCT or white point, of the LEDs. Moreover, when replacing incandescent light bulbs, it is important that the LED light source have a compact form factor, e.g., that is no larger than the incandescent light bulbs, which increases complications. Further, there is a desire for color tunable lamps, which can be adjusted, e.g., for mood, scene and personal preferences. Accordingly, improvements in LED light sources that can produce white light is desired.

SUMMARY

In accordance with an embodiment of the present invention, a tunable CCT white point light source is produced light source is provided using a plurality of LED chips with slightly different pump wavelengths with a wavelength converting element that includes at least two different wavelength converting materials that convert the light to different colors of light. The wavelength converting element receives the light from the plurality of LED chips and converts at least a portion of the light to different colors. The wavelength converting element may be, e.g., a stack or mixture of phosphor or luminescent ceramics. The intensity of the light produced by the LED chips may be altered to vary the intensity of at least one color of light converted by the wavelength converting element to control the white point of the resulting light. Moreover, with the use of same type of LED chips, the plurality of LED chips can be mounted close together on one or more submounts resulting in a compact, high brightness design.

DETAILED DESCRIPTION

In accordance with an embodiment of the present invention, a uniform high brightness light source with a tunable CCT white point is produced using a wavelength converting element along with plurality of light emitting diode chips with slightly different pump wavelengths. The wavelength converting element includes at least two different wavelength converting materials that convert light to different colors of light and may be, e.g., a stack or mixture of phosphor or luminescent ceramics. Because the CCT of the resulting device can be controlled to produce a pleasing white light, the light source may be suitable for, e.g., spot or accent lamp type applications or other applications in which a compact white light source is desired.

Figure 1:
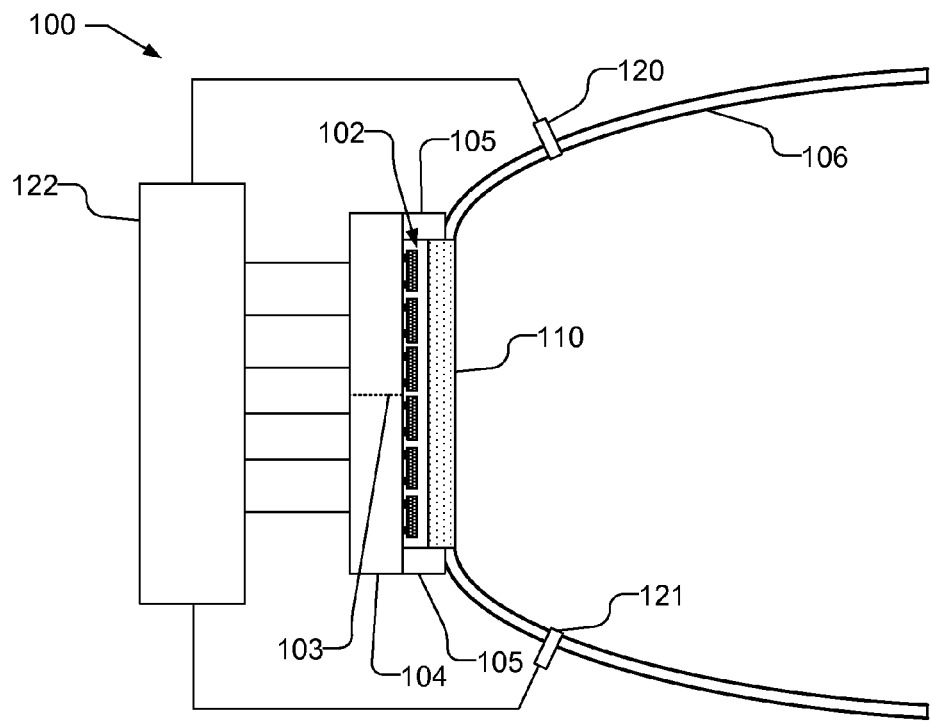
FIG. 1 is a side view of a light source, in accordance with an embodiment of the present invention.

FIG. 1 is a side view of a light source 100, in accordance with an embodiment of the present invention. Light source 100 can produce light having a tunable CCT white point, which may be used, e.g., as an accent light application. Light source 100 includes an array of LEDs 102 that may be mounted to a heat sink 104. A wavelength converting element 110 is mounted over the array of LEDs 102 and is held, e.g., by supports 105 that are mounted to or integrally formed from the heat sink 104. Reflector optics 106 are positioned to focus the light from the wavelength converting element 110 and to form the desired light distribution pattern. The reflector optics 106 may be mounted to the heat sink 104, e.g., via supports 105, or otherwise optically coupled to receive the light from the wavelength converting element 110. In one embodiment, an intensity detector 120 may be mounted to the reflector optics 106 and coupled to a drive circuit 122. The intensity detector 120 may be, e.g., a spectrometer or in another embodiment, more than one detectors may be used with spectral filters having different ranges of wavelengths, as illustrated by detector 121. The intensity detector 120 measures the intensity of the light being produced by the wavelength converting element 110 and in response the drive circuit 122 controls the intensity of the individual LEDs 102 in the array. By way of example, the drive circuit 122 may use pulse modulation or current control to alter the intensity of a certain die. Alternatively, the drive circuit 122 may simply turn off or increase power to certain die.

The LEDs 102 in the array produce light having the same general color, e.g., blue, but that intentionally differ in wavelength by an appreciable amount, e.g., by approximately 5 nm, 10 nm, 20 nm, or more, but less than approximately 50 nm. The use of LEDs that have the same color is advantageous as all the LEDs may be manufactured using the same die technology. Accordingly, the general manufacturing process is simplified as different types of LEDs need not be manufactured. Moreover, the mounting of LEDs 102 is simplified because the mounting requirements for all the LEDs 102 are the same. Consequently, the LEDs 102 may be mounted near each other on the same submount. If desired more than one submount may be used, as illustrated by broken line 103. It should be understood that LEDs may be grouped electrically, where within a group the LEDs differ less by less than approximately 5 nm, i.e., they are from the same bin, but other LEDs or groups of LEDs in the array differ by approximately 5 nm or more.

Figure 2:
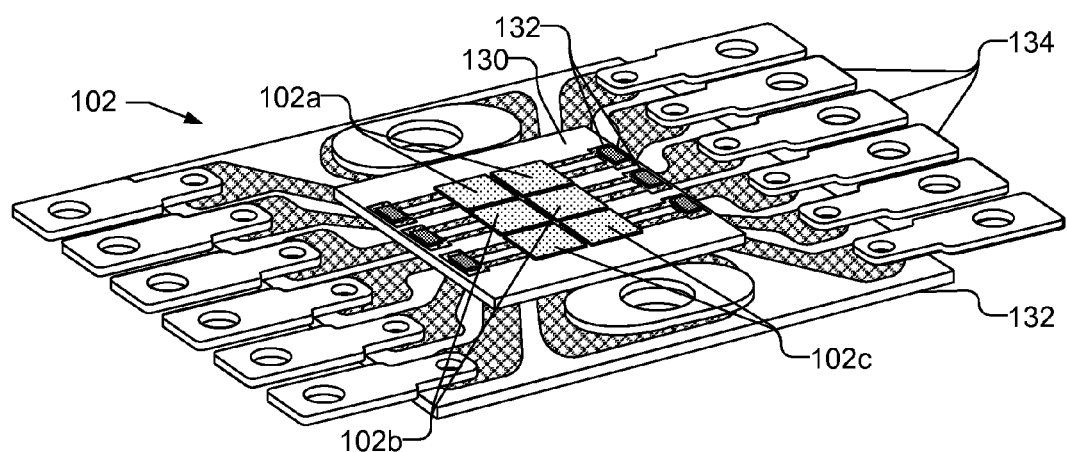
FIG. 2 illustrates a perspective view of an array of LEDs that may be used with the light source.

FIG. 2 illustrates a perspective view of an array of LED chips 102 that may be used with the light source 100. As discussed above, the LEDs 102 are produced from the same die technology, which permits the dice to be placed close together on at least one submount 130, thereby improving luminance. Electrostatic discharge (ESD) circuits 131 are also mounted on the submount 130. The submount 130, which may be ceramic or other appropriate material is attached to a direct bond copper (DBC) substrate 132 with a plurality of electrical leads 134. The DBC substrate 132 is connected to the heat sink 104, shown in FIG. 1, by a mechanical fastener or other appropriate mechanism, such as epoxy. As discussed above, two or more of the LEDs 102 emit light within the same general color, e.g., blue, but that have slightly different wavelengths. By way of example, LEDs 102a, 102b, and 102c produce light having wavelengths of approximately 430 nm, 450 nm and 470 nm, respectively.

Figure 3:
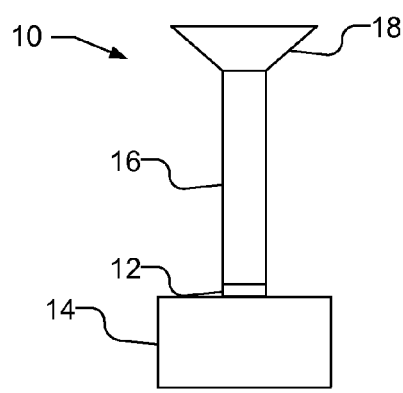
FIG. 3 illustrates a side view of an accent lamp that uses different colored LEDs and FIG. 4 illustrates a top plan view of the LEDs used in the accent lamp of FIG. 3.
Figure 4:
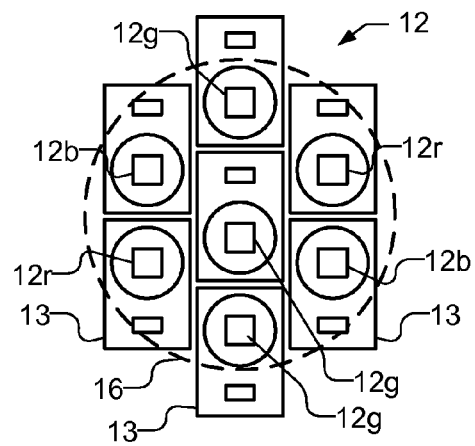

By way of comparison, FIG. 3 illustrates a side view of an accent lamp 10 that uses different colored LEDs 12 and FIG. 4 illustrates a top plan view of those LEDs 12. Lamp 10 uses different types of LEDs 12, e.g., blue LEDs 12b, green LEDs 12g, and red LEDs 12r to produce the different colors desired. The LEDs 12 are mounted on a heat sink 14. Because the LEDs 12 produce different colored light, an integrating rod 16 is used to mix the produced light. The outline of the integrating rod 16 is illustrated in FIG. 4 with a circular dotted line, but the integrating rod 16 may have another geometrical shape, such as hexagonal. As illustrated in FIG. 3, a lens 18 is coupled to the end of the integrating rod 16 and is used to produce the desired distribution of light.

In comparison to the light source 100 described above, the use of different types of LEDs 12 may result in reduced luminance, as well as an increase in the difficulties of manufacturing. For example, the different types of LEDs 12 must be manufactured separately. Moreover, the different types of LEDs 12 must contend with different mounting requirements. Accordingly, as illustrated in FIG. 4, the different LEDs 12 are mounted on separate submounts 13 increasing the area of the light source because of the relatively large gaps between the LEDs 12. Accordingly, the lamp 10 suffers from a loss in brightness as well as a loss in compactness. Further, because the LEDs 12 produce different colored light, the light must be mixed using, e.g., a long integration rod 16, resulting in a large accent lamp 10.

Referring back to FIG. 1, the wavelength converting element 110 includes two or more wavelength converting materials. By way of example, the wavelength converting element 110 may be a stack of different wavelength converting materials, e.g., a stack of multiple phosphor layers, or alternatively may be a single layer that contains a mixture of multiple phosphors. In one embodiment, the wavelength converting element 110 may be a stack of different luminescent ceramics or may be a single luminescent ceramic that contains a mixture of different types of luminescent material. By way of example, luminescent ceramics that include YAG, SSON, BSSN and/or eCAS may be used. Thus, the wavelength converting element 110 produces light that is well combined and does not require the use of integration optics. Accordingly, the light source 100 may have a compact design and produce uniform light.

Figure 5:
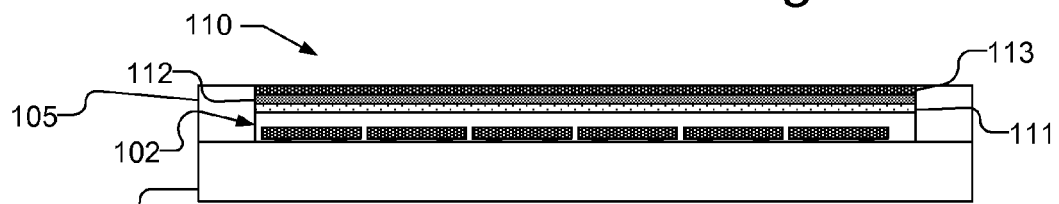
FIGS. 5-8 schematically illustrate side views of different embodiments of the wavelength converting element.
Figure 6:
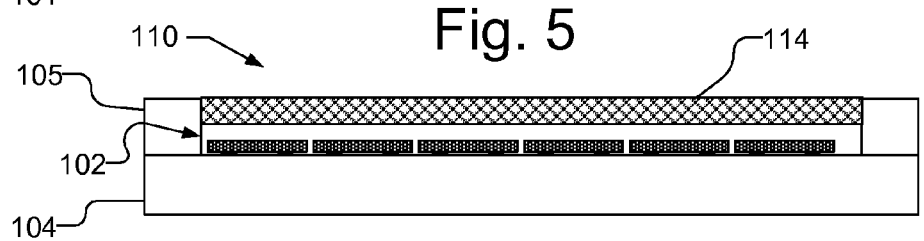
Figure 7:
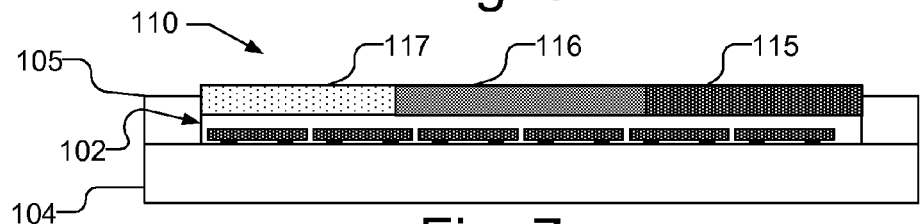
Figure 8:
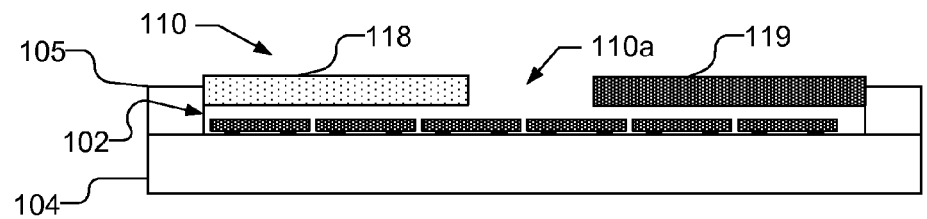

FIGS. 5-8 schematically illustrate side views of different embodiments of the wavelength converting element 110 that is held by supports 5 over the array of LEDs 102. FIG. 5, for example, illustrates the wavelength converting element 110 as including a stack of different wavelength converting layers 111, 112, and 113, which include different wavelength converting materials. The layers 111, 112, 113 may be, e.g., phosphor plates and/or luminescent ceramics. Wavelength converting layers 111, 112, and 113 contain materials that emit Green, Red, and Yellow light, respectively. FIG. 6 illustrates the multicolor wavelength converting element 110 as a single layer 114 that contains a mixture of, e.g., Green, Red, and Yellow emitting materials. As illustrated in FIG. 7, other embodiments of the wavelength converting element 110 are possible, such as positioning the different wavelength converting materials 115, 116, and 117 next to each other horizontally, as opposed to vertically. FIG. 8 illustrates another embodiment in which the wavelength converting element 110 includes horizontally positioned wavelength converting materials 118 and 119, and an aperture 110a through which unconverted pump light is emitted.

It should be understood that FIGS. 5-8 are examples of the wavelength converting element 110 that includes two or more wavelength converting materials. If desired, different embodiments or combinations of the different embodiments shown in FIGS. 5-8 may be used. For example, FIGS. 5 and 6 may be combined to produce a stack of wavelength converting layers, in which one layer contains a mixture of two or more wavelength converting materials. Alternatively, horizontally positioned wavelength converting materials and/or an aperture (e.g., FIGS. 7 and 8) may be included with the stack or mixture of wavelength converting materials (e.g., FIGS. 5 and 6). The wavelength converting materials may be spray coated or screen printed on a separate carrier plate. By way of example, in the case of screen printing, the different wavelength converting materials may be printed as different dots next to each other. For color mixing purposes, it may be beneficial for there to be a distance between the wavelength converting materials and the LEDs.

The two or more wavelength converting materials in the wavelength converting element 110 have different absorption and excitation characteristics. By altering the intensity of the light from two or more LEDs 102 that differs in wavelength by an appreciable amount, the spectral distribution of the resulting light, i.e., the forward emitted light from the wavelength converting element 110 and the pump light from the LEDs 102 transmitted through the wavelength converting element 110, may be controlled to produce a desired white point CCT around a nominal value.

Figure 9:
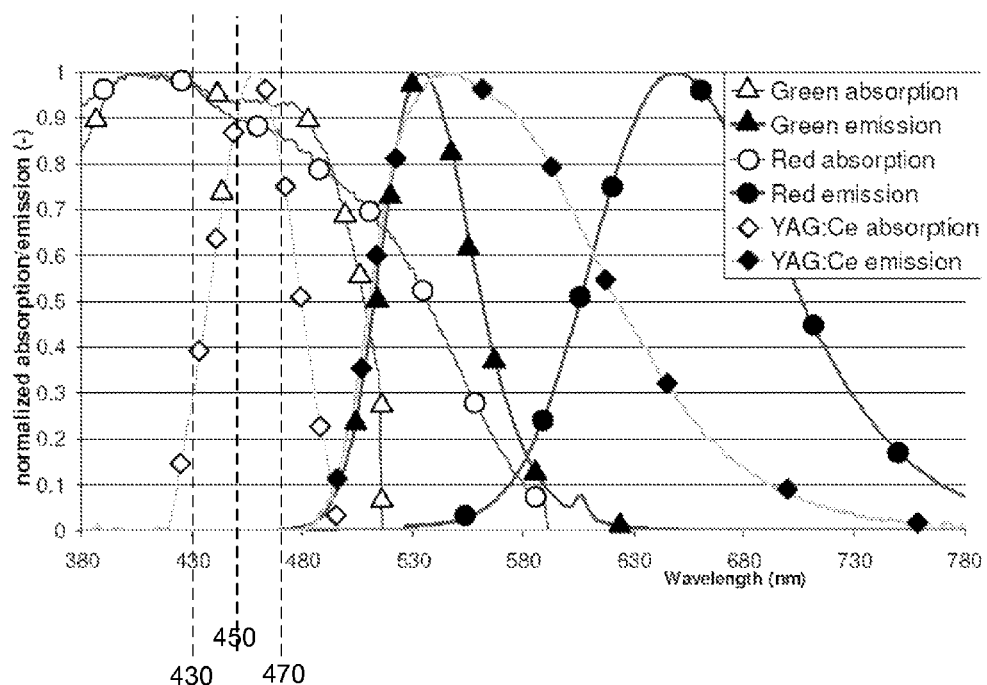
FIG. 9 is a graph illustrating the absorption and emission spectra for green, red and YAG phosphor plates, which may be stacked or mixed to form wavelength converting element.

FIG. 9 is a graph illustrating the absorption and emission spectra for green, red and YAG phosphor plates, which may be stacked or mixed to form wavelength converting element 110. As can be seen, the YAG has relatively narrow absorption spectra while the red and green phosphors have much wider absorption spectra.

FIG. 9 also illustrates with broken lines 430 nm, 450 nm, and 470 nm wavelengths that may be produced by LEDs 102a, 102b, and 102c as described above. By controlling the intensity of the different wavelengths produced by the LEDs 102, the color point of the light produced by the light source 100 can be altered. For example, by varying the intensity of the blue light at 450 nm, the ratio of the YAG (yellow) converted light with respect to the Red (and Green) converted light can be altered. If the LEDs 102 produce blue light having a greater intensity at the wavelengths absorbed by the YAG, i.e., 450 nm, the YAG emission will increase thereby producing a warmer white color point. By reducing the intensity of the 450 nm blue light, less light is absorbed by the YAG, causing a decrease in the emission of the YAG and a cooler white color point. Similarly, variation of the intensity of the other wavelengths, i.e., 430 nm and 470 nm, may also be used to vary the color point of the resulting light.

The adjustment of the intensity of the light produced by LEDs 102 may be performed during manufacturing of the light source 100, i.e., by testing the light produced by the assembled lamp 100 and adjusting and setting the intensity of the different LEDs 102*a*, 102*b*, and 102*c* to produce the desired white point. Alternatively, an intensity detector 120 may be used as illustrated in FIG. 1. In another embodiment, the wavelength converting element 110 may be adjusted, e.g., by changing one of the wavelength converting layers in the stack to have a desired thickness, to produce the desired CCT of the resulting light. In another application, the end user is permitted to adjust the color of the lamp according the end user's needs or desires, by changing the ratio of currents to the different LEDs (or groups of LEDs).

Figure 10:
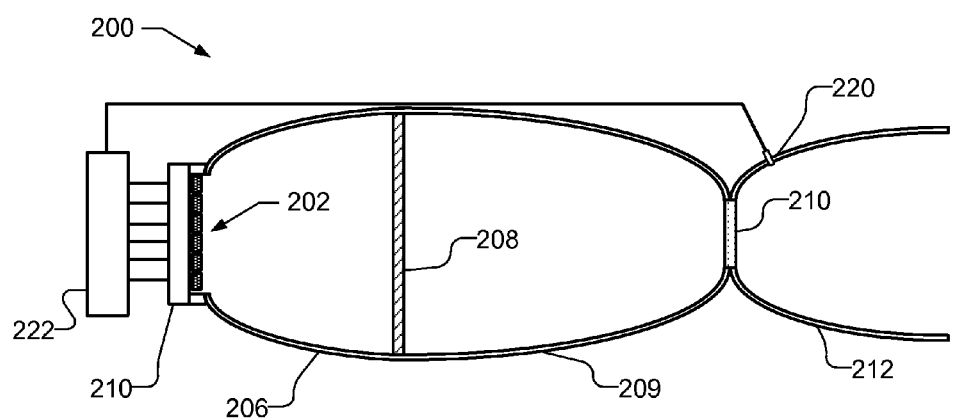
FIG. 10 is another embodiment of a light source.

FIG. 10 is another embodiment of a light source 200 that includes an array of LEDs 202, which includes at least two LEDs that emit light having the same general color but appreciably different wavelengths and a wavelength converting element 210 that includes at least two different wavelength converting materials. The array of LEDs 202 is mounted on a heat sink 204. A collimator element 206 approximately collimates the light emitted by the LEDs 202, which is transmitted through a wavelength selection element 208, such as a dichroic filter, which, e.g., transmits blue light and reflects longer wavelengths. A concentrator element 209 concentrates the light to be incident on the wavelength converting element 210. Any back emitted light from the wavelength converting element 210 is recycled by the wavelength selection element 208, which reflects the light back to the wavelength converting element 210. A reflector element 212 is positioned to focus the light from the wavelength converting element 210 and to form the desired light distribution pattern. As illustrated in FIG. 10, the light source 200 may include an intensity detector 220 and drive circuit 222, if desired, which may be similar to that described in reference to light source 100.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A light source comprising:
   a plurality of light emitting diode chips solely of the same type that produce the same general color having wavelengths that differ by 5 nm to 50 nm;
   a single wavelength converting element mounted to receive the light emitted by the plurality of light emitting diode chips, the wavelength converting element comprising at least two different wavelength converting materials that convert the light from the at least two of the plurality of light emitting diode chips to different colors of light; and
   a drive circuit coupled to the plurality of light emitting diode chips, the drive circuit independently controlling the intensity of the light emitted by at least one of the plurality of light emitting diode chips.

2. The light source of claim 1, wherein the wavelength converting element comprises a stack of wavelength converting films.

3. The light source of claim 1, wherein the wavelength converting element comprises a mixture of the different wavelength converting materials that convert the light from the at least two light emitting diode chips to different colors of light.

4. The light source of claim 3, wherein the mixture of the different wavelength converting materials is approximately homogenous.

5. The light source of claim 1, wherein the wavelength converting element comprises one or more luminescent ceramics.

6. The light source of claim 1, wherein the wavelength converting element comprises one or more phosphor layers.

7. The light source of claim 1, further comprising at least one submount, the at least two light emitting diode chips mounted to the at least one submount.

8. The light source of claim 7, further comprising:
   a heat sink, the at least one submount being mounted on the heat sink; and
   a support that is coupled to the heat sink, the support holding the wavelength converting element.

9. The light source of claim 7, wherein the at least one submount is a single submount and the at least two light emitting diode chips are mounted on the single submount.

10. The light source of claim 1, wherein the plurality of light emitting diode chips are blue LED chips, and the wavelength converting element comprising at least three wavelength converting materials that respectively emit green, red, and yellow light.

11. The light source of claim 1, wherein:
   the plurality of light emitting diode chips are grouped electrically, each group having light emitting diode chips having wavelengths that differ by 5 nm or less, and groups having wavelengths that differ by 20 nm or less; and
   the driver circuit is coupled to the groups, the driver circuit independently controlling the intensity of the light emitted by the groups.

* * * * *